United States Patent [19]

Kuhn

[11] Patent Number: 5,793,101
[45] Date of Patent: Aug. 11, 1998

[54] PACKAGE HOUSING MULTIPLE SEMICONDUCTOR DIES

[75] Inventor: Harry A. Kuhn, Phoenix, Ariz.

[73] Assignee: Intel Corporation, Santa Clara, Calif.

[21] Appl. No.: 781,358

[22] Filed: Jan. 21, 1997

Related U.S. Application Data

[62] Division of Ser. No. 402,933, Mar. 13, 1995, Pat. No. 5,719,436.

[51] Int. Cl.⁶ .......................... H01L 23/495; H01L 23/34; H01L 23/48; H01L 23/52

[52] U.S. Cl. .......................... 257/676; 257/723; 257/784; 257/778; 257/668; 438/106

[58] Field of Search .......................... 252/668, 676, 252/723, 784, 778

[56] References Cited

U.S. PATENT DOCUMENTS 5,012,323  4/1991  Farnworth .......................... 257/723
5,585,668  12/1996  Burns .......................... 257/676

FOREIGN PATENT DOCUMENTS 4-155856  5/1992  Japan .......................... 257/723

Primary Examiner—Teresa Maria Arroyo
Attorney, Agent, or Firm—Blakely, Sokoloff, Taylor & Zafman

[57] ABSTRACT

A package housing multiple semiconductor die includes a leadframe having a paddle and a number of lead fingers. A flexible circuit is adhesively laminated to both sides of the paddle. A first semiconductor die is back-mounted to the bottom surface of the paddle and wire-bonded to the flexible circuit and the lead fingers. A second semiconductor die is back-mounted to the top surface of the paddle and to the flexible circuit. The dies are encapsulated in a security coating and encased in plastic.

6 Claims, 5 Drawing Sheets

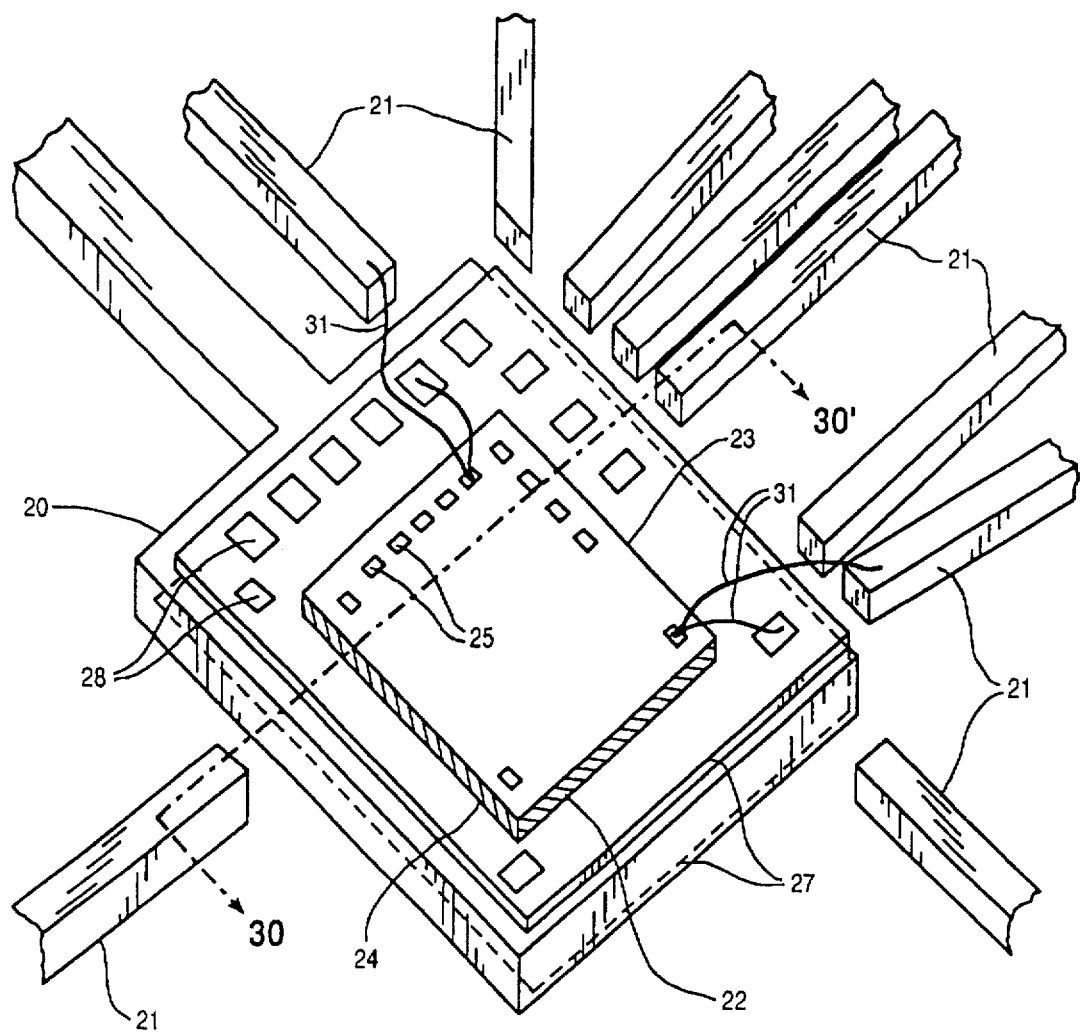
FIG_1

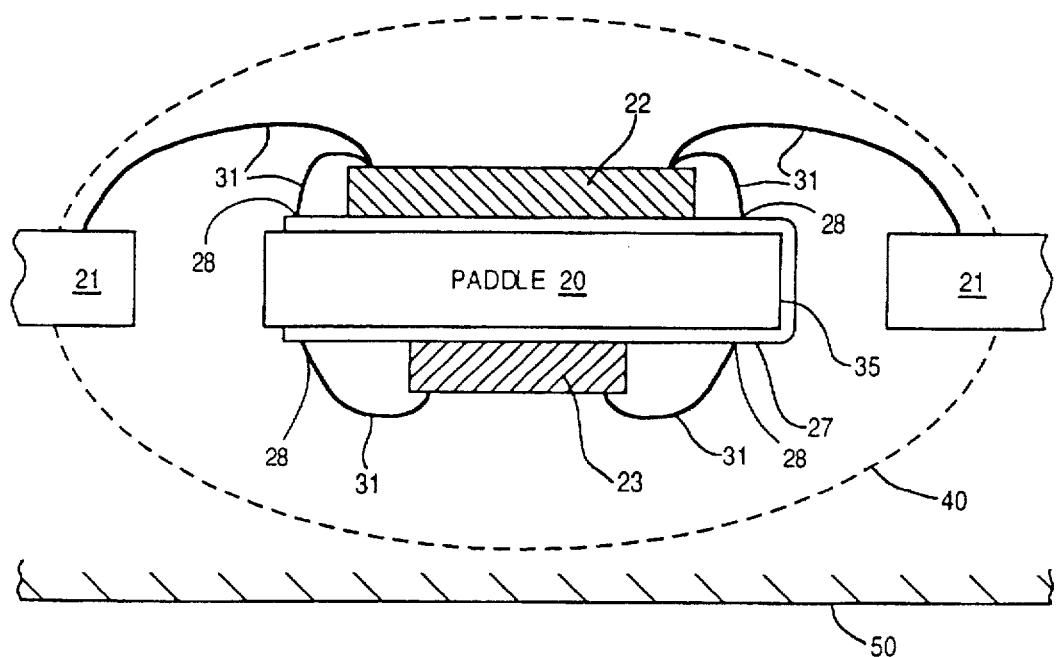
FIG_2

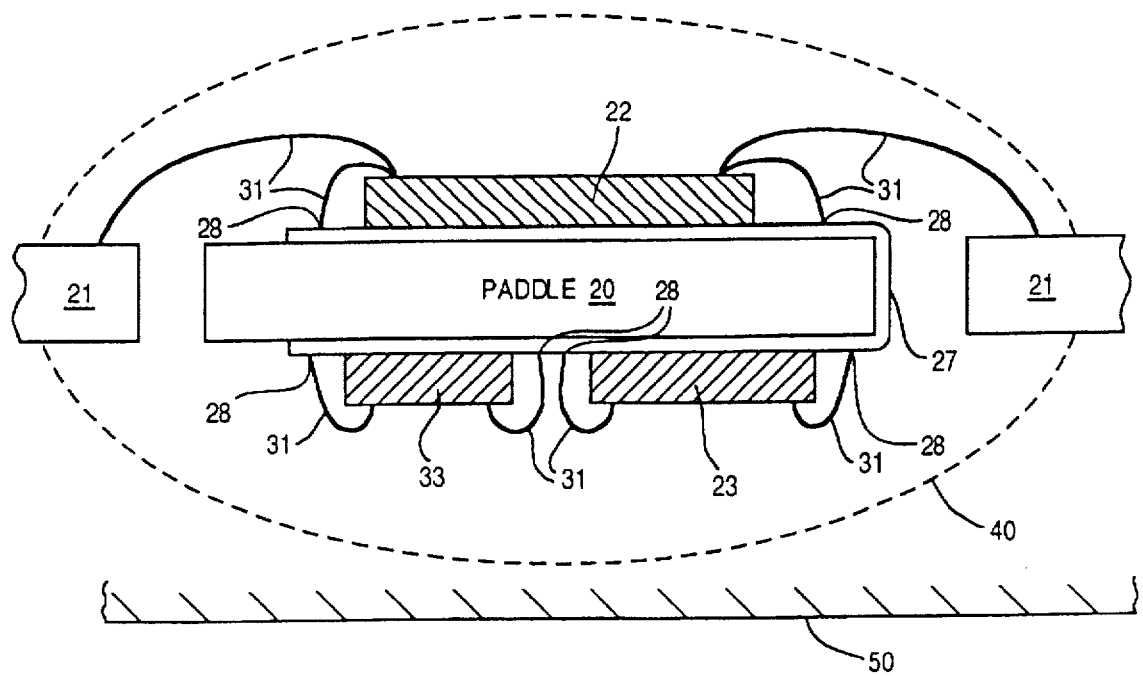
FIG_3

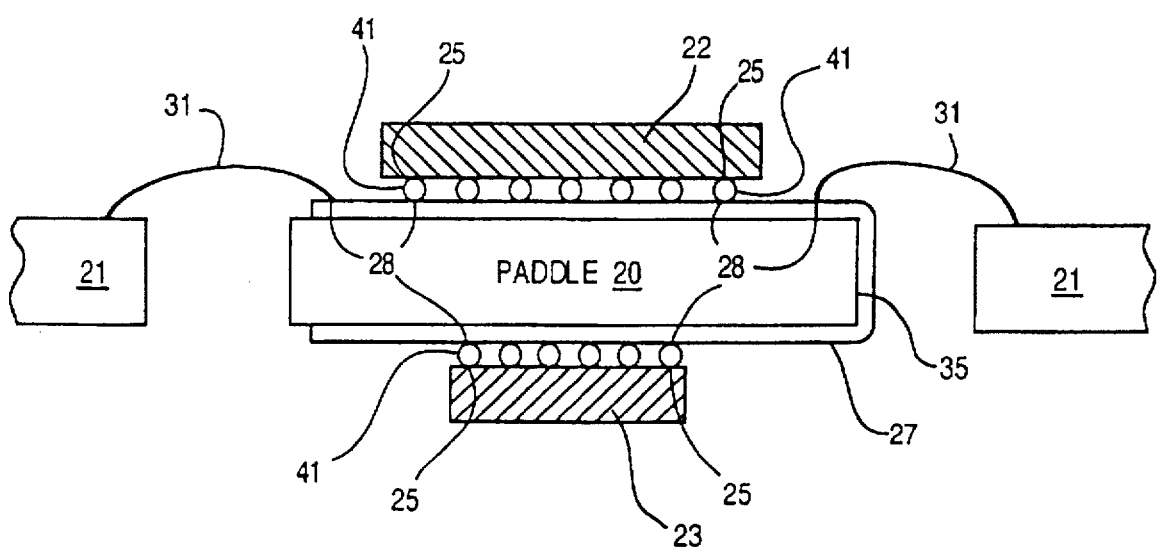
FIG_4

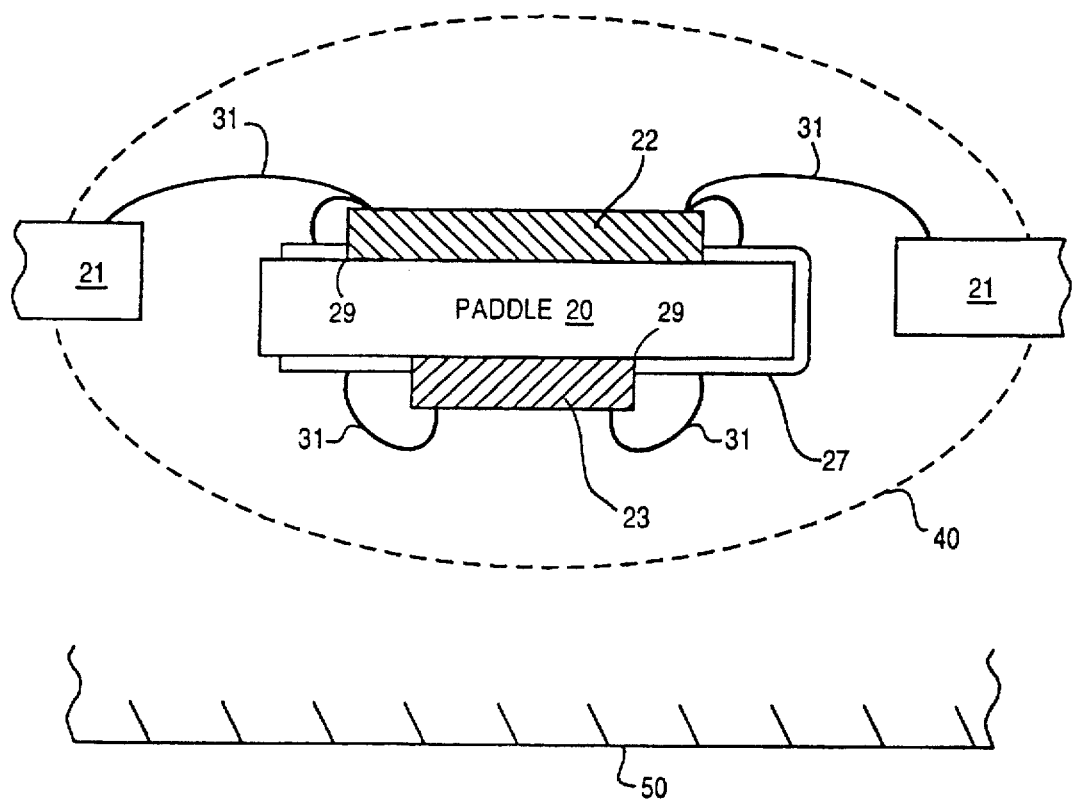
FIG_5

PACKAGE HOUSING MULTIPLE SEMICONDUCTOR DIES

This is a divisional of application application Ser. No. 08/402,933, filed Mar. 13, 1995

FIELD OF THE INVENTION

This invention relates to the field of semiconductor packaging technologies. More specifically, the invention relates to packages which incorporate two or more semiconductor dies in a single enclosure.

BACKGROUND OF THE INVENTION

Electronic circuits integrated on a semiconductor substrate are commonly housed within packages suited to the particular integrated circuit (IC) device. A typical semiconductor package comprises a leadframe which interconnects the IC to external circuitry located on a printed circuit board. A standard leadframe is larger than the size of the integrated circuit die so that bonding pad regions on the die can be wire-bonded to extensions or "fingers" of the leadframe. After the IC on the die has been wire-bonded to the leadframe, the assembly is normally encapsulated in plastic or some other type of packaging material. Terminals connected to the leadframe fingers extend outside the packaging material to provide points of interconnection to other electronic components.

A continuing goal of the semiconductor industry is to maximize circuit density. One past scheme for increasing circuit density has been to house multiple semiconductor die in a single package. By way of example, multi-chip semiconductor packages are disclosed in U.S. Pat. Nos. 5,012,323 and 5,019,893. The problem with prior art multi-chip packages, however, is that they either require the use of a specially-adapted custom package, or they impose size restrictions on the semiconductor dies that may be housed together. In addition, conventional dual die semiconductor packages often mandate a custom bonding pad routing for the ICs so that interconnection can be made to a single leadframe. Thus, past efforts have often resulted in costly package designs limited in use to specific die sizes or particular bonding pad configurations.

Another drawback associated with traditional multi-die packages is that many designs fail to address the problem of insuring adequate data and code security. Because modern semiconductor devices represent a tremendous investment of time, money, and human effort, there is a heightened concern among manufacturers to find new ways of preventing access to critical or sensitive functional portions of the integrated circuitry. This concern has lead to an increased demand for semiconductor packages which include adequate protection mechanisms against outside intrusion.

For example, today many designers wish they could integrate a microprocessor or controller (or some other function) with additional non-volatile flash memory (e.g., 8 MBytes) in a single package offering security protection. A typical application might have the flash memory storing highly proprietary code that is accessed or executed by the controlling processor. For obvious reasons, such code must be kept secret. In this type of system, it is desirable to have code or programs only be addressed through the microprocessor or controller. The problem with previous packaging technologies has been the inability to prohibit access to information stored in on or both of the semiconductor devices from outside intruders.

Therefore what is needed is a semiconductor package which increases circuit density by housing multiple semiconductor die in a single leadframe package while overcoming the drawbacks of the prior art. Furthermore, the package should render functionality important circuitry inaccessible to outside intruders, and critical algorithms, code, or programs should remain hidden from interloping copiers or competitors.

As will be seen, the present invention is a multi-die semiconductor package that allows a wide variety of existing semiconductor chips to be integrated on the same leadframe with relatively little change to the standard packaging process flow. The invention also obviates changes to the bond pad routing of the ICs. Performance is enhanced by providing greater package density at a lower manufacturing cost. The invented multiple semiconductor die package also permits implementation of powerful encryption/decryption systems to prevent interrogation of hidden integrated circuit functions.

SUMMARY OF THE INVENTION

The present invention is a package housing two or more semiconductor die. The invented package greatly increases IC density and is capable of accommodating a variety of different sizes of semiconductor die.

In one embodiment, the semiconductor package of the present invention comprises a leadframe which includes a rectangular paddle and a number of lead fingers extending near to the paddle. A flexible (or "flex") circuit is adhesively attached to both sides of the paddle. A first semiconductor die is then bonded to the bottom surface of the paddle and wire-bonded to the flexible circuit. The leadframe is then turned over and the operation repeated with a second semiconductor die being attached to the opposite or top surface of the paddle. Wires are used to electrically connect the integrated circuits on the first and second semiconductor die to the flexible circuit and to the lead fingers of the leadframe. In each case, the semiconductor dies are attached with their back sides mounted on the flex circuit against opposing surfaces of the paddle. In other embodiments, the semiconductor dies may be mounted face down; that is, with the integrated circuit mounted against and facing the flex circuit.

Finally, the leadframe is either encapsulated in plastic or another suitable material. A polymer security coating may be dispensed and cured to cover the semiconductor dies prior to encapsulation in the casing material.

Special advantages are achieved by the present invention in applications where the upper chip comprises a processor or controller device and the lower chip comprises a memory (e.g., a flash memory). In such cases, the invented package permits the implementation of an encryption/decryption scheme with the versatility of the controller coupled to the maximum density of a large flash memory array while preventing interrogation of hidden functions. Programs, code, or algorithms for encrypting data may be stored on the lower memory chip and addressed solely through the controlling upper semiconductor chip. Such a system prohibits direct memory access to the lower chip and provides a powerful data security system in a compact single leadframe package.

BRIEF DESCRIPTION OF THE DRAWINGS

The present invention will be understood more fully from the detailed description which follows and from the accompanying drawings, which however, should not be taken to limit the invention to the specific embodiments shown, but are for explanation and understanding only.

FIG. 1 is a sectional perspective view of one embodiment of the semiconductor package of the present invention.

FIG. 2 is a cross-sectional side view of the embodiment illustrated in FIG. 1.

FIG. 3 is a cross-sectional side view of another embodiment of the present invention.

FIG. 4 is a cross-sectional side view of yet another embodiment of the present invention.

FIG. 5 is a cross-sectional side view of still another embodiment of the present invention.

DETAILED DESCRIPTION

In the following description, a package housing multiple semiconductor die is set forth in specific detail in order to provide a thorough understanding of the present invention. It will be obvious, however, to one skilled in the art that these specific details may not be needed to practice the present invention. In other instances, well-known methods, materials, processing techniques, etc., are not described in detail in order to avoid unnecessarily obscuring the present invention.

Referring now to FIG. 1, there is shown a sectional perspective view of one embodiment of the multiple semiconductor die package of the present invention. The package comprises a leadframe which includes a die-mounting paddle 20 and a plurality of lead fingers 21 extending near to, but not contacting, paddle 20. The leadframe is fabricated in the standard manner according to conventional packaging technology wherein the die paddle 20 is a rectangular platform located in the center of the leadframe and held in place at one or more points. In the embodiment of FIG. 1 paddle 20 and lead fingers 21 are located in the same general plane and are fabricated from the same material.

With continuing reference to FIG. 1, a first semiconductor die 22 is shown comprising an essentially wafer-thin rectangular solid having an upper surface 23 on which is constructed an integrated circuit. The bottom or back surface 24 of die 22 is mounted on a flexible interconnect circuit 27. As can be seen, paddle 20 is larger than flexible circuit 27 and semiconductor die 22.

In accordance with one embodiment of the invention, flexible ("flex") circuit 27 is adhesively attached to the upper and lower primary surfaces of paddle 20. By way of example, flex circuit 27 is normally bonded to the upper primary surface with an adhesive glue, wrapped around the side of the paddle, and then adhesively bonded to the lower primary surface of paddle 20. It is appreciated that the upper and lower primary surfaces of the paddle are essentially parallel to one another and perpendicular to the side surfaces.

Flex circuit 27 may be bonded to paddle 20 using a variety of methods. For instance, flex circuit 27 may be manufactured with an adhesive backing to allow straightforward attachment to the paddle surfaces. Alternatively, flex circuit 27 may be bonded utilizing conventional adhesives. A polyimide adhesive may be utilized to tightly hold flexible circuit 27 against the surfaces of paddle 20 to prevent formation of air bubbles between paddle 20 and the flex circuit 27.

Flex circuit 27 is made up of a plurality of interconnects connected to sets of bonding pads 28. FIG. 1 illustrates a set of bonding pads 28 being arranged about flex circuit 27 so as to define a die-mounting area for semiconductor die 22 over the upper surface of paddle 20. Likewise, another set of bonding pads 28 are disposed to provide a second die-mounting area for a second semiconductor die mounted over the lower surface of paddle 20 (see FIG. 2).

All of the interconnect lines of flex circuit 27 may be embedded in a flexible insulating material that extends over the side of paddle 20 to provide electrical interconnection between the first set of bonding pads 28 located on the upper surface of paddle 20 and the second set of bonding pads 28 located on the bottom surface of paddle 20. Typically, flex circuit 27 is on the order of 1.5 thousandths of an inch thick, and easily fits in the space separating lead fingers 21 from one side of paddle 20.

Semiconductor die 22 has a front surface on which is constructed integrated circuitry that includes a plurality of input/output (I/O) bond pads 25, usually distributed around the periphery of the die. In accordance with one embodiment, extremely fine wires 31, typically comprising gold or aluminum, are utilized to electrically connect I/O bond pads 25 with bonding pads 28 and/or lead fingers 21.

FIG. 2 illustrates a cross-sectional side view of the package of FIG. 1 taken across cut lines 30–30'. As can be seen, FIG. 2 shows semiconductor die 22 mounted on flex circuit 27 against the upper surface of paddle 20. Flex circuit 27 is wrapped around a side 35 of paddle 20 and includes a second set of bonding pads 28 that define another die-mounting area for a second semiconductor die 23. Semiconductor die 23 is mounted against the lower primary surface of paddle 20.

Instead of mounting the semiconductor dies 22 and 23 to the flex circuit insulation material, an alternative is to have the die-mounting areas removed from flex circuit 27 so that openings are defined large enough to fit the associated die. Such an embodiment is shown in FIG. 5 is which the semiconductor dies 22 and 23 are mounted directly against paddle 20 within openings 29. Flex circuit 27 is still laminated to paddle 20, but because the material of the flex circuit no longer insulates the die from the paddle there is better thermal conduction. Hence, this alternative is well-suited for ICs having high power dissipation.

In the embodiment of FIG. 2, integrated circuitry is constructed on the outward face of semiconductor dies 22 and 23. Each die has a back that is devoid of circuitry. In accordance with the present invention, the back of semiconductor dies 22 and 23 is mounted against flex circuit 27, which is laminated to the upper and lower primary surfaces of paddle 20, respectively. In other words, the integrated circuitry fabricated on the faces of semiconductor dies 22 and 23 is exposed to permit wire-bonding. Connections are made from various I/O bond pads 25 of the respective die to bonding pads 28 on flex circuit 27 via wires 31. It should be understood that an assortment of wire-bonding techniques may be employed during the manufacturing process in accordance with the present invention.

In an alternative embodiment, one or both of the dies may be mounted face down against the flex circuit using the well-know "flip-chip" mounting technique. By way of example, FIG. 4 illustrates a configuration in which dies 22 and 23 are mounted face-down against flex circuit 27 in a "flip-chip" manner. Flip-chip mounting involves forming solder bumps 41 on the bond pads 25 of the integrated circuitry. Flex circuit 27 is manufactured such that when the die is placed face-down against the flex circuit substrate, solder bumps 41 align to corresponding bonding pads 28 (or similar metal connection points) of the flex circuit. The respective faces of dies 22 and 23 thereby adjoin the sections of the flex circuit laminated to the upper and lower surfaces of paddle 20.

Thus, flip-chip mounting obviates wire bonding to connect the integrated circuitry to the flex circuit. Of course, wires 31 are still needed to interconnect flex circuit 27 (e.g., via additional bonding pads 28) to lead fingers 21 of the frame.

With reference again to FIG. 2, an exemplary process useful for the manufacture of the package shown in that embodiment may include the following steps. First, once flex circuit 27 has been adhesively attached to paddle 20 the backside die (semiconductor die 23) is bonded to the lower surface of paddle 20 on a die-mounting area of flex circuit 27. Die 23 may be mounted using ordinary epoxy adhesive. Next, wires 31 are bonded to I/O pads 25 of the integrated circuit constructed on die 23 and to corresponding bonding pads 28 on flex circuit 27. The configuration of bonding pads 28 on flex circuit 27 is originally adapted for the particular semiconductor die.

An implementation of the invented semiconductor package in an encrypted system would maximize the number of connections between semiconductor dies 22 and 23 and minimize the number of connections from die 22 to lead fingers 21. For example, sensitive address and data line connections between dies 22 and 23 would be made via wire bonds from bonding pads 25 to bonding pads 28, but not also to fingers 21. Wire connections from pads 25 to pads 28 and lead fingers 21 for die 22 would be limited to power supply lines and basic I/O signals.

Designing an interconnect routing between sets of pads 28 is a relatively simple and low-cost operation as compared to prior art methods which normally involved defining locations and routing patterns for I/O bond pads 25 of the integrated circuit. One of the advantageous features of the present invention is that no changes need be made to the IC fabricated on the die—the only essential requirement is that bonding pads 28 of flex circuit 27 be distributed beyond the edges of die 23 so as to provide a sufficient die-mounting area. Furthermore, note that no wires 31 are used to interconnect semiconductor die 23 with lead fingers 21. In other words, semiconductor die 23 is only interconnected to flex circuit 27. This aspect of the present invention advantageously makes it possible to implement a data security scheme.

After die 23 has been mounted and wire-bonded to flex circuit 27, the leadframe may be flipped over and the same process repeated with respect to semiconductor die 22. The only difference in the operations is that wires 31 are used to bond the integrated circuit of die 22 to both the flex circuit 27 and to lead fingers 21. By way of example, some of bond pads 25 on die 22 may only be connected to lead fingers 21, others only to pads 28 on flex circuit 27, and still others to both pads 28 and fingers 21. Once all wire bonding has been completed, the semiconductor die, paddle, and lead fingers are encased in a packaging material 50, which typically comprises plastic. The processing steps employed for encasing the components are well known and standard in the packaging industry.

To provide maximum protection against intrusion, a security coating 40 is applied to cover both of the semiconductor dies prior to the encasing procedure. This aspect of the invention is shown in FIG. 2 wherein security coating 40 is a conformal coating of a material that encapsulates the die to prevent physical tampering of the integrated circuitry. In one embodiment, a polymer encapsulate is used as security coating 40. Ideally, the material used should be impervious to visual light, or to other forms of penetrating radiation, e.g., X-rays. The purpose of security coating 40 is to provide physical protection to the integrated circuitry housed within the package. Therefore, any material utilized as a security coating 40 should have properties which include adhesion to the surface of the semiconductor die such that any attempts to penetrate coating 40 result in substantial destruction of the integrated circuitry constructed therein.

As discussed earlier, the present invention provides an excellent package for implementing an encryption/decryption system. The invented package is also ideally-suited for integrating two or more die having complementary functions in the same leadframe. As an example, semiconductor die 22 of FIG. 2 may comprise a microprocessor or microcontroller device with semiconductor die 23 comprising a non-volatile flash memory. Because semiconductor die 23 is bonded only to pads 28 of flex circuit 27, it may only be accessed through the integrated circuitry of semiconductor die 22. This permits a great deal of flexibility in devising encryption/decryption techniques which can make it virtually impossible for an intruder to access data, programs, code, or algorithms stored on semiconductor die 23. Moreover, the back-to-back relationship of semiconductor dies 22 and 23, coupled with the use of security coating 40, makes it extremely difficult for a would-be copier to physically penetrate the package for the purpose of probing either of the semiconductor die. Thus, the present invention is well-suited for special applications which require maximum data security. Furthermore, the invention is easily adapted for use with many different semiconductor devices and package types since the flex circuit 27 need only be changed to accommodate different components or die.

With reference now to FIG. 3, there is shown a cross-sectional view of another embodiment of the multi-die package of the present invention. In FIG. 3, a single semiconductor die 22 is mounted against the portion of flex circuit 27 that is laminated to the upper primary surface of paddle 20. Two semiconductor dies 23 and 33 are shown mounted against the portion of flex circuit 27 that is laminated to the lower primary surface of paddle 20. The flex circuit bonding, die-mounting, and wire-bonding operations for the embodiment of FIG. 3 are the same as described in conjunction with FIGS. 1 and 2.

Practitioners in the art will appreciate the only limitation on the number of chips that may be housed within a single package in accordance with the present invention is that the paddle 20 must be large enough to accommodate each of the individual die. In the case where more than two semiconductor die are mounted against paddle 20, flex circuit 27 needs to have sets of bonding pads 28 arranged so as to define separate die-mounting areas for the respective die. It is worth noting that there is no strict limit on the relative sizes of the semiconductor dies; that is, semiconductor die 22 may be larger than or smaller than semiconductor die 23 (FIG. 2), and semiconductor die 22 may be larger than or smaller than the combination of semiconductor dies 23 and 33 (FIG. 3).

Whereas many alterations and modifications to the present invention will no doubt become apparent to the person of ordinary skill in the art after having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

I claim:

1. A method of packaging multiple semiconductor dies comprising the steps of:

(a) providing a leadframe having a paddle with first and second substantially parallel primary surfaces and a plurality of lead fingers which extend near to the paddle;

(b) laminating a flex circuit to the first and second primary surfaces of the paddle such that a first portion of the flex circuit having a first set of bonding pads providing a first die-mounting area covers the first primary surface, and a second portion of the flex circuit having a second set of bonding pads providing a second die-mounting area covers the second primary surface, the flex circuit having a plurality of interconnects embedded therein, the plurality of interconnects providing electrical connection between the first and second sets of bonding pads;

(c) mounting first and second semiconductor dies against the first and second die-mounting areas, respectively, the first and second semiconductor dies each having a back and a face with integrated circuitry constructed thereon, the paddle and the first and second semiconductor dies each having a lateral dimension associated therewith, the lateral dimension of the paddle being larger than the lateral dimensions of either the first or second semiconductor dies;

(d) coupling the integrated circuitry of the first and second semiconductor dies to the flex circuit and to the plurality of lead fingers; and (e) encasing the first and second semiconductor dies.

2. The method of claim 1 wherein the backs of the first and second semiconductor dies are mounted against the first and second die-mounting areas, respectively, in step (c).

3. The method of claim 2 wherein step (d) comprises the steps of:

wire-bonding the integrated circuitry on the face of the first semiconductor die to the first set of bonding pads; and wire-bonding the integrated circuitry on the face of the second semiconductor die to the second set of bonding pads.

4. The method of claim 1 further comprising the step, prior to step (e), of:

conformably coating the first and second semiconductor dies with a material that encapsulates the first and second semiconductor dies.

5. A semiconductor package comprising:

a leadframe which includes a plurality of lead fingers and a paddle having a body with a side and first and second substantially parallel primary surfaces;

first and second semiconductor dies each having a face with integrated circuits fabricated thereon and a back, the paddle and the first and second semiconductor dies each having a lateral dimension associated therewith, the lateral dimension of the paddle being substantially parallel to the first and second primary surfaces and larger than the lateral dimensions of either the first or second semiconductor dies;

means for mounting the first and second semiconductor dies against the first and second primary surfaces of the paddle, respectively;

wherein the mounting means includes a flex circuit having a plurality of interconnects embedded therein, the flex circuit being laminated to the first and second primary surfaces of the paddle, with the plurality of interconnects electrically coupling the integrated circuitry of the first and second semiconductor dies;

means for electrically coupling at least the first semiconductor die to the lead fingers; and means for encasing the semiconductor dies.

6. The semiconductor package of claim 5 wherein the backs of the first and second semiconductor dies are mounted against the first and second primary surfaces, respectively.

* * * * *